United States Patent
Villion

(10) Patent No.: US 8,296,621 B2
(45) Date of Patent: Oct. 23, 2012

(54) INTEGRATED CIRCUIT COMPRISING ERROR CORRECTION LOGIC, AND A METHOD OF ERROR CORRECTION

(75) Inventor: Mathieu Villion, Toulouse (FR)

(73) Assignee: Freescale Semiconductor, Inc., Austin, TX (US)

(*) Notice: Subject to any disclaimer, the term of this patent is extended or adjusted under 35 U.S.C. 154(b) by 584 days.

(21) Appl. No.: 12/593,514

(22) PCT Filed: Apr. 4, 2007

(86) PCT No.: PCT/IB2007/052780
§ 371 (c)(1),
(2), (4) Date: Sep. 28, 2009

(87) PCT Pub. No.: WO2008/122845
PCT Pub. Date: Oct. 16, 2008

(65) Prior Publication Data
US 2010/0131822 A1    May 27, 2010

(51) Int. Cl.
*H03M 13/00* (2006.01)
(52) U.S. Cl. ........................................ 714/758; 714/786
(58) Field of Classification Search ............. 375/240.26; 714/3, 776, 784, 752, 758, 786
See application file for complete search history.

(56) References Cited

U.S. PATENT DOCUMENTS

| | | | |
|---|---|---|---|
| 7,447,980 B2* | 11/2008 | Xu et al. | 714/776 |
| 7,694,204 B2* | 4/2010 | Schmidt et al. | 714/758 |
| 7,890,845 B2* | 2/2011 | Denk et al. | 714/784 |
| 7,937,644 B2* | 5/2011 | Schmidt et al. | 714/758 |
| 8,000,395 B2* | 8/2011 | Yousef | 375/240.26 |
| 2006/0268726 A1 | 11/2006 | Alamaunu et al. | |
| 2009/0177940 A1* | 7/2009 | Guo et al. | 714/752 |
| 2010/0146325 A1* | 6/2010 | John | 714/3 |

FOREIGN PATENT DOCUMENTS

| | | |
|---|---|---|
| EP | 1603325 A1 | 12/2005 |
| WO | 2006/030409 A | 3/2006 |
| WO | 2006/085326 A | 8/2006 |

OTHER PUBLICATIONS

International Search Report and Written Opinion correlating to PCT/IB2007/052780 dated Dec. 28, 2007.

* cited by examiner

*Primary Examiner* — David Ton

(57) ABSTRACT

An integrated circuit comprises forward error correction (FEC) decoder logic being coupled to memory and arranged to receive data, comprising application data, from a host application process. The FEC decoder logic performs error detection upon the received data. Logic is further arranged to transmit error free application data back to the host application process prior to performing error correction; and store in memory only application data in which errors are detected.

20 Claims, 7 Drawing Sheets

FIG. 1 – PRIOR ART
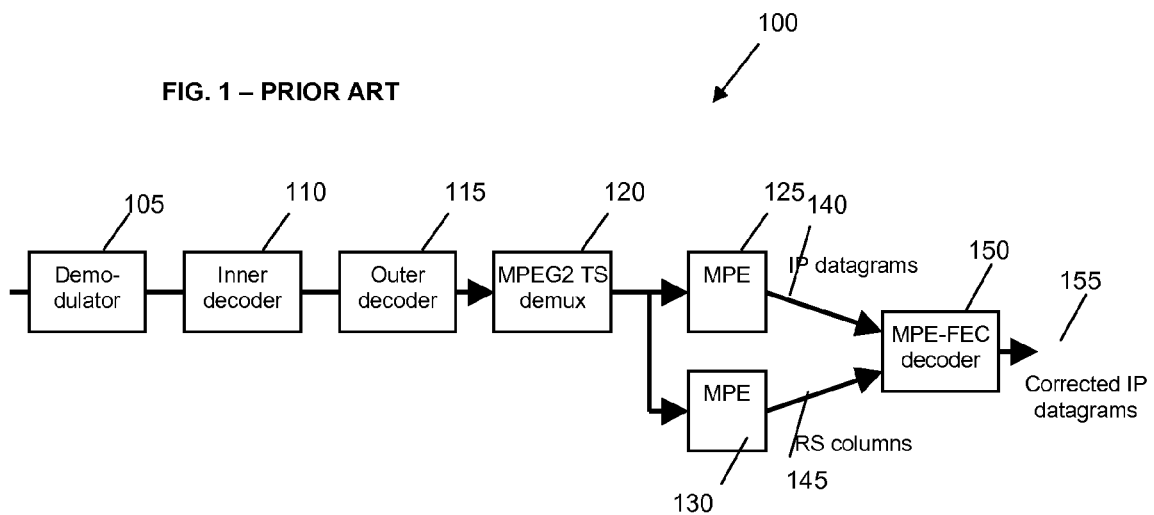
FIG. 2 – PRIOR ART
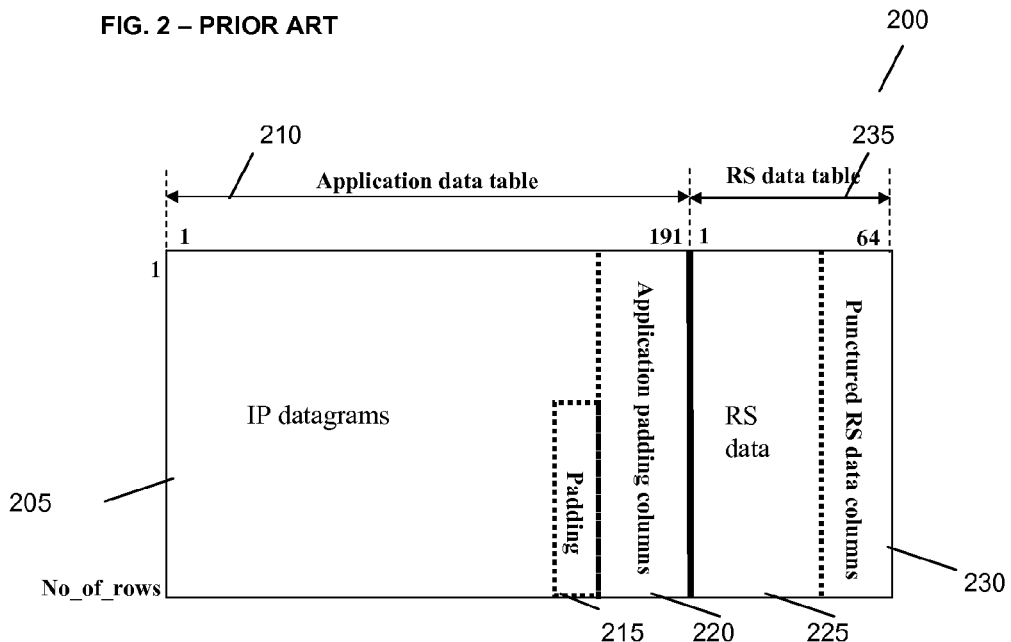

INTEGRATED CIRCUIT COMPRISING ERROR CORRECTION LOGIC, AND A METHOD OF ERROR CORRECTION

TECHNICAL FIELD

The technical field of the invention relates to an integrated circuit and method for error correction. In particular, the invention relates to an integrated circuit and method for multi-protocol encapsulation forward error correction.

BACKGROUND

Present day data communication networks, both wireless and wire-line, have a requirement to transfer data between communication units. Data, in this context, includes many forms of communication, such as speech, multimedia, signalling, etc. Typically, such data communication needs to be effectively and efficiently transported, in order to optimise use of limited communication resources.

Due to the recent growth in communications, particularly in Internet and wireless communications, there exists a need to provide improved data transfer techniques, where a particular quality of service of the transmitted data is often required or desired by the end user.

The European Telecommunication Standards Institute (ETSI) has defined a number of communication standards with the aim that a number of manufacturers are able to provide equipment that supports the same technology and are able to inter-operate with other equipment compliant with that standard. One such data communication standard developed by ETSI is the Terrestrial Digital Video Broadcasting (DVB-T) standard (ETSI EN 300 744), which has been developed for digital television sets and set-top boxes.

A recent variation of the DVB-T standard that has been adopted to incorporate enhanced features to allow improved reception of digital video broadcasting services for mobile devices is the digital video broadcasting-handset (DVB-H) standard. A DVB-H unit is battery powered, and the nature of the broadcast transmission offers a possibility to the DVB-H unit to repeatedly power off components/circuits of the DVB-H unit's receiver chain to increase battery life. It is anticipated that DVB-H units may receive transmissions at a variety of locations, such as: indoor, outdoor, as a pedestrian, within a moving vehicle, etc.

One feature that has been incorporated within the DVB-H standard that facilitates this aim of mobile reception is the use of multi protocol encapsulated-forward error correction (MPE-FEC) of received data. MPE-FEC facilitates recovery of data by a receiver in situations of high data-packet loss, which can occur when a receiver is in a changing environment, for example when a receiver is moving. MPE-FEC regroups data into blocks (MPE-FEC frames) and performs forward error correction on these data blocks. For an efficient error correction mechanism, a common approach is to have MPE-FEC frames larger than 512 Kbits. Thus, a receiver operating within a DVB-H compatible system receives an MPE-FEC frame with up to 2 Mbit of data over a single channel in a relatively short time period, for example 200 millisecond.

Historically, DVB-T originally was meant for MPEG2 video transmitted in MPEG2 Transport Steam (TS). MPEG2 TS is protected with Reed Solomon (RS) Forward Error Correction (FEC) codes. Then application of Multi-protocol Encapsulation (MPE) decoding enables transport of Internet Protocol (IP) data packets. Thus, to cope with mobile propagation degradation, DVB-H introduced another layer of RS FEC called MPE-FEC. Here, only MPE blocks with incorrect cyclic redundancy check (CRC) are further processed by the MPE FEC decoder. If the CRC fails, the whole block is discarded. Zeros are then inserted at the proper byte positions in the RS code words, instead of the block data, and are marked as "unreliable". If there are more than 64-unreliable byte positions in a RS code word, the RS decoder cannot correct anything, and therefore just outputs the bytes without error correction.

Referring now to FIG. 1, a known MPE-FEC decoder 100, as proposed in the EN 301 192 V1.4.1 standard, is illustrated. The MPE-FEC decoder comprises a demodulator 105 for demodulating a received signal, followed by an inner decoder 110 and outer decoder 115 for decoding the demodulated received signal. The inner decoder is a convolutional decoder. The reception is typically implemented using a soft-decision Viterbi decoder. This reduces the effect of thermal noise and interference on the quality of the received signal, as Viterbi errors are generally bursty in nature. A Reed-Solomon decoder is used as the outer decoder, which feeds the decoded, demodulated received signal into an MPEG2 Transport Stream (TS) de-multiplexer to de-interleave received data packets. The MPE data packets are then divided into IP datagrams 125, 140 and RS column data 130, 145. A typical table of MPE-FEC data is illustrated in FIG. 2. These MPE data packets are then input into an MPE-FEC decoder 150 to provide output corrected IP datagrams 155.

Referring now to FIG. 2, a known MPE-FEC table 200 contains redundant information that can be used to remove errors not corrected by the inner and outer decoders of FIG. 1. The MPE-FEC table 200 comprises an Application data table 210 comprising IP datagrams 210, some padding 215 and Application padding columns 220. In addition, an RS data table 235 comprises RS data 225 and punctured RS data columns 230. The 64 punctured RS data columns carry redundancy information of the Application data table 210.

The MPE-FEC decoder 150 uses the MPE data packets to generate syndromes for the received data, which indicate the presence of errors within the IP datagrams 125, 140, and are used to estimate the location of the errors within the MPE-FEC frame. Once errors have been located, forward error correction can then be performed to correct the errors.

Given the relatively high complexity of FEC decoding, it is known to implement MPE-FEC decoding within a discrete hardware module, such as a discrete integrated circuit (IC) package, which may be operatively coupled to, for example, a host application process. Such MPE-FEC decoding modules receive MPE-FEC frames from the host application process, and store them in memory in order to perform forward error correction thereon.

As previously mentioned, it is common to have MPE-FEC frames larger than 512 Kbits. Thus, a receiver operating within a DVB-H compatible system receives an MPE-FEC frame with up to 2 Mbit of data. Consequently, in order for an MPE-FEC decoder module to store an entire MPE-FEC frame in memory, it is necessary for the MPE-FEC decoder module to comprise at least 2 Mbit of memory dedicated for that purpose.

As will be appreciated by a skilled artisan, for mobile devices, battery life is not the only consideration. Size and cost are also important key drivers in the design and manufacturing of such devices. The need to provide 2 Mbit of memory within a discrete hardware module adds both size and cost to an IC. Consequently, such a need is problematic.

Thus, a need exists for an improved integrated circuit comprising a decoder, and a method of decoding.

SUMMARY OF INVENTION

In accordance with aspects of the invention, there is provided an integrated circuit and a method of error correction therefore as defined in the appended Claims.

BRIEF DESCRIPTION OF DRAWINGS

FIG. 1 illustrates a known MPE-FEC decoder.

FIG. 2 illustrates a typical table of MPE-FEC data.

DETAILED DESCRIPTION

Figure 3:
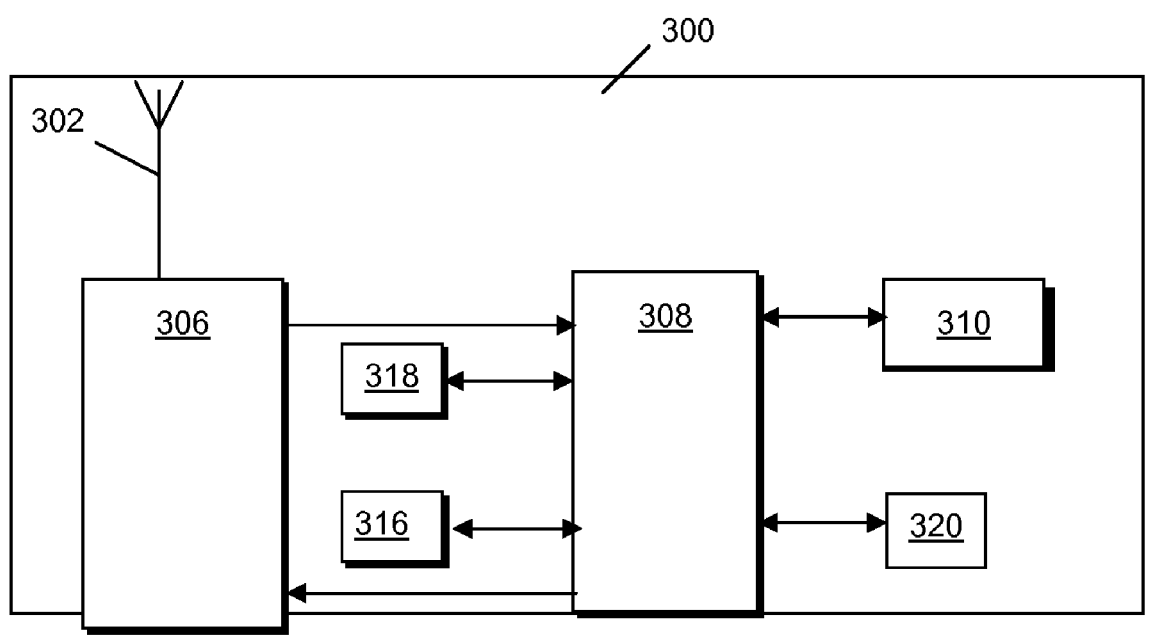
FIG. 3 illustrates a block diagram of part of a wireless communication unit, adapted to support the inventive concept of an exemplary embodiment of the invention.

Before describing in detail embodiments that are in accordance with the invention, it should be observed that the various apparatus components described herein, and as shown in the accompanying drawings, have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Referring now to FIG. 3, there is shown a block diagram of part of a wireless communication unit 300, adapted to support the inventive concept of an exemplary embodiment of the invention. The communication unit 300, in the context of the illustrated embodiment of the invention is a mobile phone with an antenna 302. As such, the communication unit 300 contains a variety of radio frequency devices or circuits 306, operably coupled to the antenna 302 that will not be described further herein. The communication unit 300 further comprises a signal processing logic 308. An output from the signal processing logic 308 is provided to a suitable user interface (UI) 310 comprising, for example, a display, keypad, loudspeaker and/or microphone.

The signal processing logic 308 is coupled to a memory device 316 that stores operating regimes, such as decoding/encoding logic and the like and may be realised in a variety of technologies such as random access memory (RAM) (volatile), (non-volatile) read only memory (ROM), Flash memory or any combination of these or other memory elements. A timer 318 is typically coupled to the signal processor 308 to control the timing of operations within the communication unit 300.

In accordance with the exemplary embodiment of the invention, the signal processing logic 308 comprises, or is operably coupled to, forward error correction (FEC) decoder logic 320.

Figure 4:
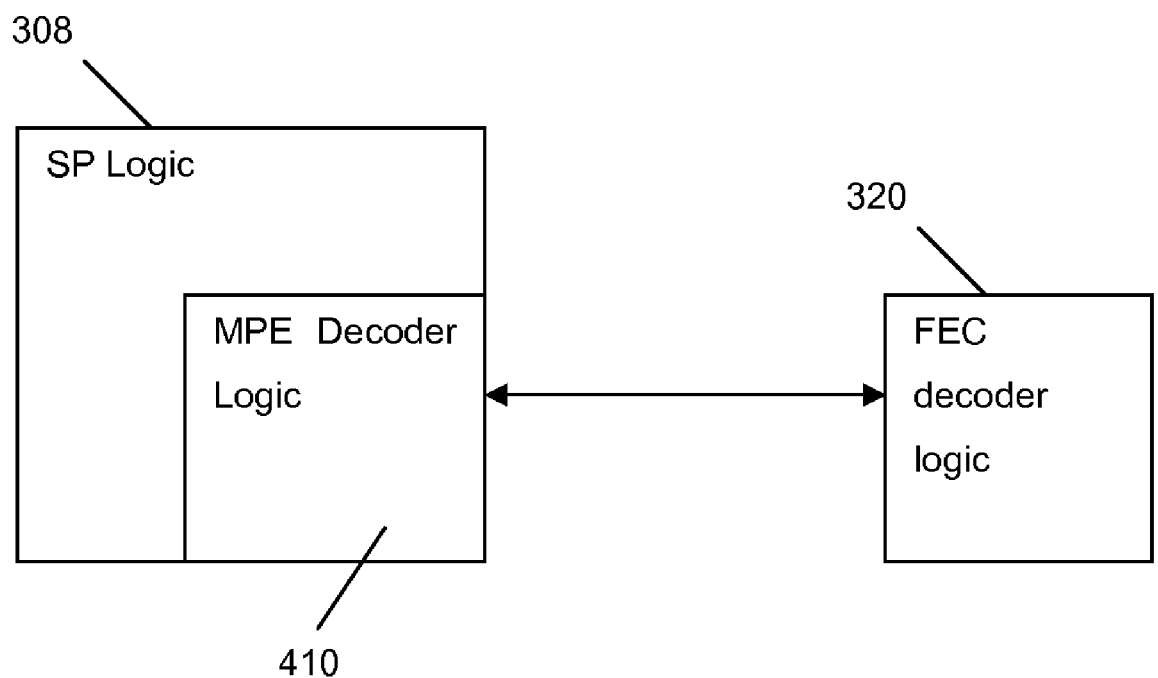
FIG. 4 illustrates apparatus for performing forward error correction according to any exemplary embodiment of the invention.

Referring now to FIG. 4 there is illustrated apparatus for performing forward error correction according to any exemplary embodiment of the invention, comprising the signal processing logic 308 and FEC decoder logic 320.

The signal processing logic 308 comprises multi-protocol encapsulation (MPE) decoder logic 410 for decoding received MPE signals, and in particular for decoding received MPE-FEC signals. Typically, and as is known in the art, the MPE decoder logic 410 comprises a demodulator for demodulating a received signal, followed by an inner decoder and outer decoder for decoding the demodulated received signal, and an MPEG2 Transport Stream (TS) de-multiplexer.

The inner decoder, in one embodiment of the invention, is a convolutional decoder. The reception is typically implemented using a soft-decision Viterbi decoder. This reduces the effect of thermal noise and interference on the quality of the received signal, as Viterbi errors are generally bursty in nature. A Reed-Solomon decoder is used as the outer decoder, which feeds the decoded, demodulated received signal into the MPEG2 TS de-multiplexer to de-interleave received data packets. The MPE data packets are then divided into IP datagrams and, for received MPE-FEC signals, Reed Solomon (RS) column data.

As is known in the art, MPE-FEC signals are adapted to undergo a further forward error correction process, known as MPE-FEC decoding, in order to correct any errors within the IP datagrams. As previously mentioned, given the relatively high complexity of FEC decoding, it is known to implement MPE-FEC decoding within a discrete module, such as a discrete integrated circuit (IC) package, operatively coupled to, for example, a host application process. Thus, for the illustrated embodiment, the signal processing logic 308, acting as the host application process, forwards the MPE data packets to the FEC decoder logic 320, for the purpose of MPE-FEC decoding.

Figure 5:
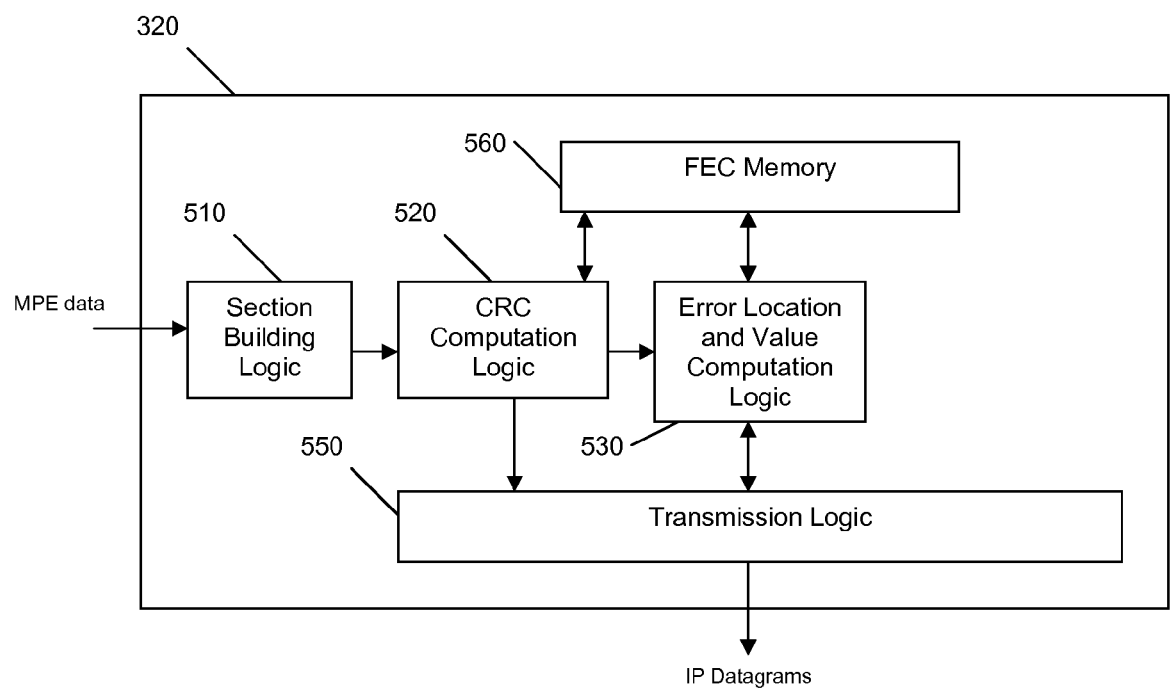
FIG. 5 illustrates FEC decoder logic according to a first exemplary embodiment of the invention.
Figure 6:
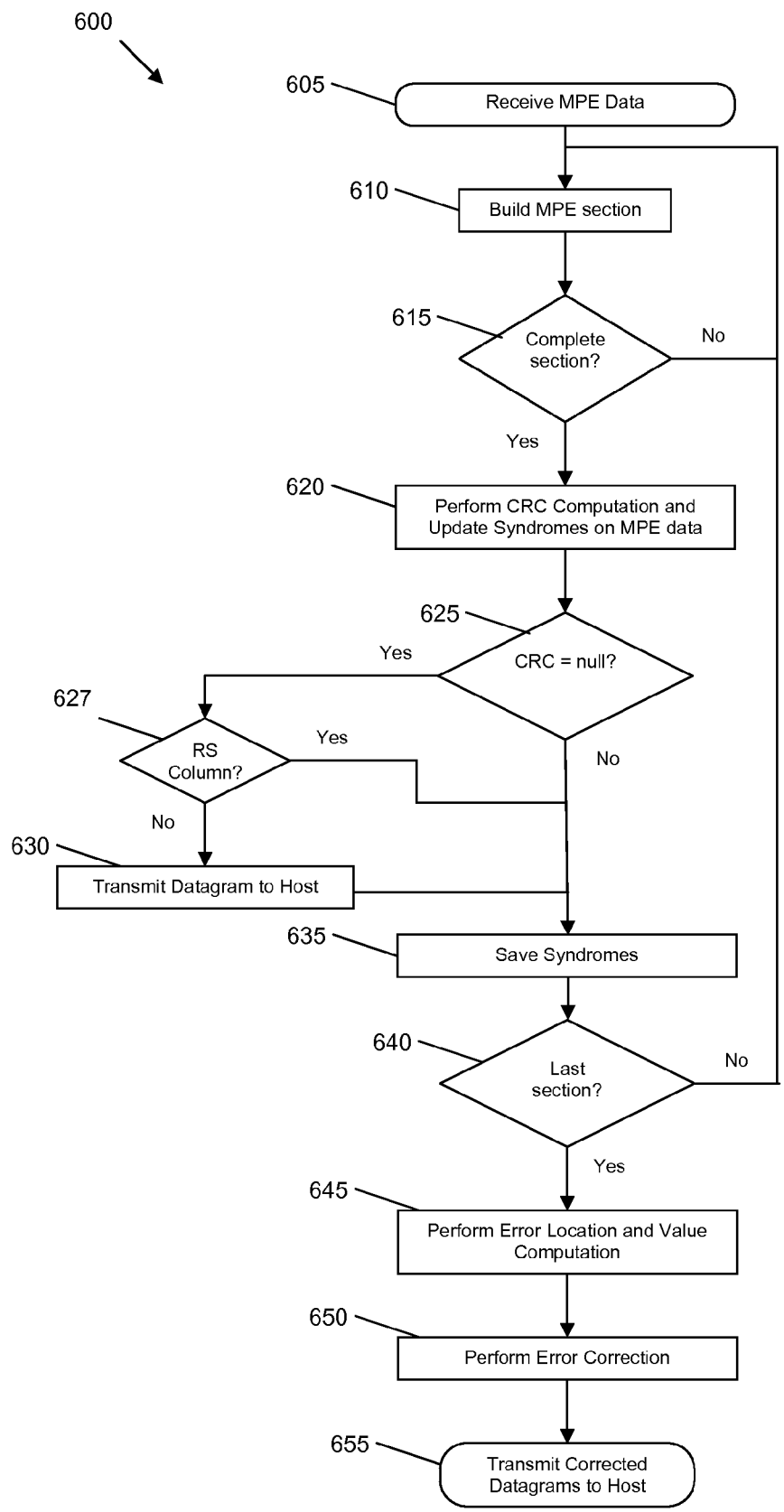
FIG. 6 illustrates a method for performing forward error correction according to a first exemplary embodiment of the invention.

Referring now to FIGS. 5 and 6, there is illustrated the FEC decoder logic 320 according to a first exemplary embodiment of the invention, and a method 600 for performing forward error correction implemented thereby.

Referring first to FIG. 6, the method 600 begins at step 605, with the receipt of data upon which forward error correction is to be performed. For the illustrated embodiment, the received data is MPE data. The FEC decoder logic 320 (illustrated in FIG. 4 and FIG. 5) receives the MPE data from a host application process, such as the signal processing logic 308.

Next, in step 610, the received MPE data is used to build an MPE section. For the embodiment illustrated in FIG. 5, this is performed by a section building logic 510. As illustrated in step 615, the section building logic 510 continues building the MPE section from receive MPE data until a complete MPE section has been built, at which point it forwards the complete MPE section to error detection logic, which for the illustrated embodiment is in the form of cyclic redundancy check (CRC) computation logic 520.

The CRC computation logic 520 performs a cyclic redundancy check on the MPE data to generate syndromes for the MPE data, in step 620, for the purpose of detecting a presence of errors within the section data.

As will be appreciated by a skilled artisan, traditionally CRC computations are computed column-wise on MPE data.

At the same time, RS syndromes are computed row-wise (64 syndromes for each row). However, for the illustrated embodiment, the syndromes are computed column-wise, as each section is received; all the 64 syndromes for each row being updated each time with values from the current section. If all the syndromes of a row are null then this row does not contain any errors, and is considered to be 'error free'. Consequently, application data, such as IP datagrams bytes, contained within the MPE row, or for RS columns the RS data, is considered to be correct.

Thus, having performed CRC on the current section in step 620, it is determined whether the CRC is equal to null for the current section, in step 625. If the CRC is equal to null, the method moves to step 627, where it is determined whether the MPE section is an RS column, or whether it contains application data, such as IP datagrams.

If the section is an RS column, the column data and syndromes are saved, in step 635. However, if the section comprises, for example, IP datagram data, correct IP datagrams are transmitted back to the host application process, in step 630. Thus, for the embodiment illustrated in FIG. 5, where an MPE section contains data from MPE sections with a correct CRC, the IP datagram data contained therein is provided to transmission logic 550. The transmission logic 550 then forwards the IP datagrams back to the host application process. The syndromes for the IP datagram are then saved, in step 635, before moving on to step 640.

Referring back to step 625, if the CRC of the MPE section is not equal to null, the section data is considered to contain errors. Where this is the case, the method 600 moves to step 635, where the section data and syndromes are saved. For the embodiment illustrated in FIG. 5, the CRC computation logic 520 saves the section data and syndromes in FEC memory 560. The method 600 then moves again to step 640, where it is determined whether the MPE section is the last section in the MPE-FEC frame.

In step 640 it is determined if the MPE section is the last section in, for the illustrated embodiment, an MPE-FEC frame. If the MPE section is not the last section, the method 600 loops back to step 610, where the next MPE section is built. As will be appreciated by a skilled artisan, for the embodiment illustrated in FIG. 5, the section building logic 510 may continue to build the next section substantially simultaneously to the CRC computation logic 520 performing the cyclic redundancy check on the current section.

When it is determined that the last section has been built, and error detection has been performed upon this last section, in step 640, the method 600 moves on to step 645, where the location and value of detected errors are calculated for each erroneous column of data within the MPE-FEC frame, substantially simultaneously. As is well known in the art, this may be achieved using the syndromes of the MPE rows.

For the embodiment illustrated in FIG. 5, the location and value of errors is calculated by error location and value computation logic 530. The error location and value computation logic 530 retrieves erroneous columns and their corresponding syndromes from the FEC memory 560, along with RS columns, and calculates the location and value of any errors within the received MPE data, as is known in the art. The error location and value computation logic 530 then corrects the errors in the application data, for example IP datagram data, contained within the column data, as illustrated in step 650 of method 600. Finally, the corrected application data is transmitted to the host application process in step 655.

Error locations and error value computations are performed using well-known RS decoding methods. By way of example, error location may be performed based on a combination of the two following methods:

error location is given by erasure information inferred from the CRC computations of MPE data sections and MPE-FEC RS sections;

self error location properties; e.g. Berlekemp-Massey algorithm (enables computation of an error location polynomial from a linear system based on the values of the syndromes).

Error values may also be computed by solving a system based on the values of the syndromes.

As will be appreciated, if no erroneous MPE columns comprising application data are received, then steps 645, 650 and 655 may be omitted.

For known methods of performing forward error correction by way of a discrete MPE-FEC module, application data is not transmitted back to the host application process until all MPE sections relating to a single MPE-FEC frame have been received. In this way, it is necessary for the MPE-FEC module to comprise sufficient memory to store at least an entire MPE-FEC frame (approximately 2 Mbit), as well as sufficient additional memory for enabling computation, etc.

However, in accordance with embodiments of the invention, error free application data is transmitted back to the host application process without such application data being stored within the memory of the FEC module. Consequently, the 2 Mbit memory requirement for storing an entire MPE-FEC frame can be significantly reduced. In fact, it has been determined that the memory requirement may be reduced by approximately 50%. Thus, the size and cost of an integrated circuit (IC) package comprising FEC decoder logic embodying the invention can be significantly reduced. Correspondingly, the cost of a communications device incorporating such an IC can be reduced, and the IC footprint on a printed circuit board (PCB) of the communications device is also reduced.

For the embodiment illustrated in FIGS. 5 and 6, the host application process, for example the signal processing logic 308, receives error free application data, for example IP datagrams, substantially immediately. Corrected application data is subsequently received, following correction of any detected errors. Consequently, it is necessary for the host application process to store the initial, error free application data until the corrected application data has been received. Once the corrected application data has been received, the host application process re-orders (re-formulates) the application data.

As will be appreciated by a skilled artisan, the additional storage and processing required by the host application process is necessary due to the FEC decoder logic no longer storing the error free datagrams, and to handle application data being returned out of order. However, host application processes, such as the signal processing logic 308, generally comprise sufficient memory and processing capabilities to handle this additional burden without significantly affecting performance thereof, and without requiring additional memory to be provided. Thus, by transferring the burden of storing the error free application data to the host application process, significant cost and size savings may be made in relation to the FEC decoder, without incurring additional cost or size considerations in relation to the host application process.

Figure 7:
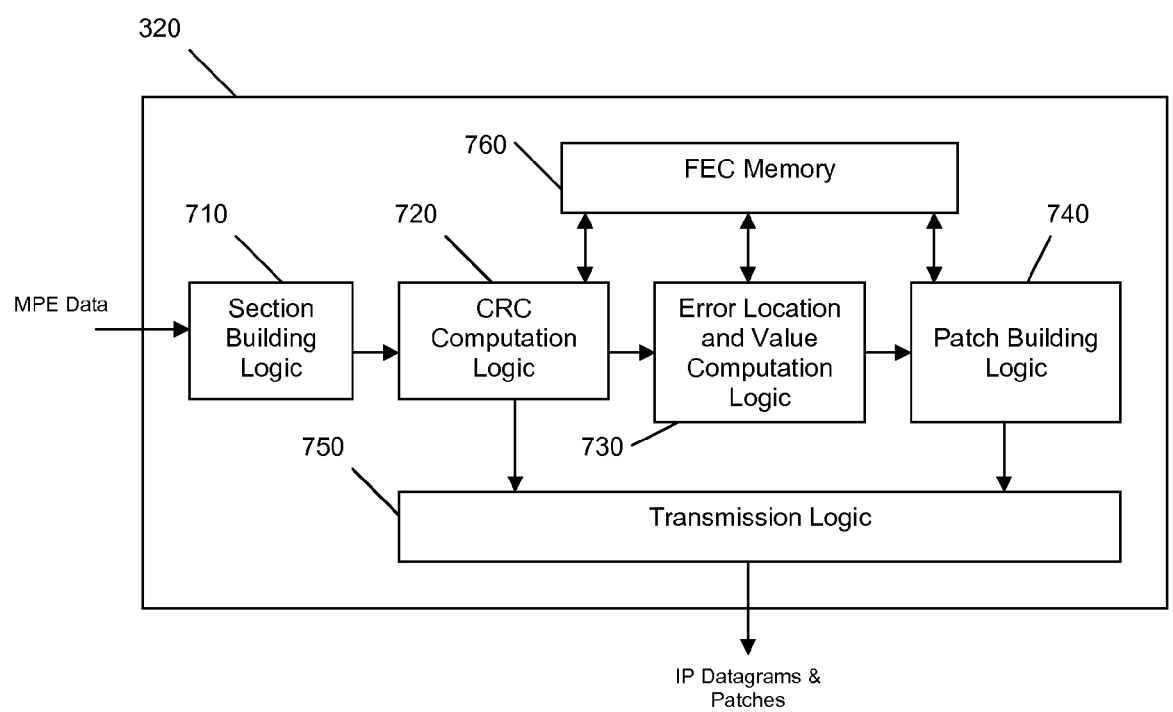
FIG. 7 illustrates FEC decoder logic according to a second exemplary embodiment of the invention.
Figure 8:
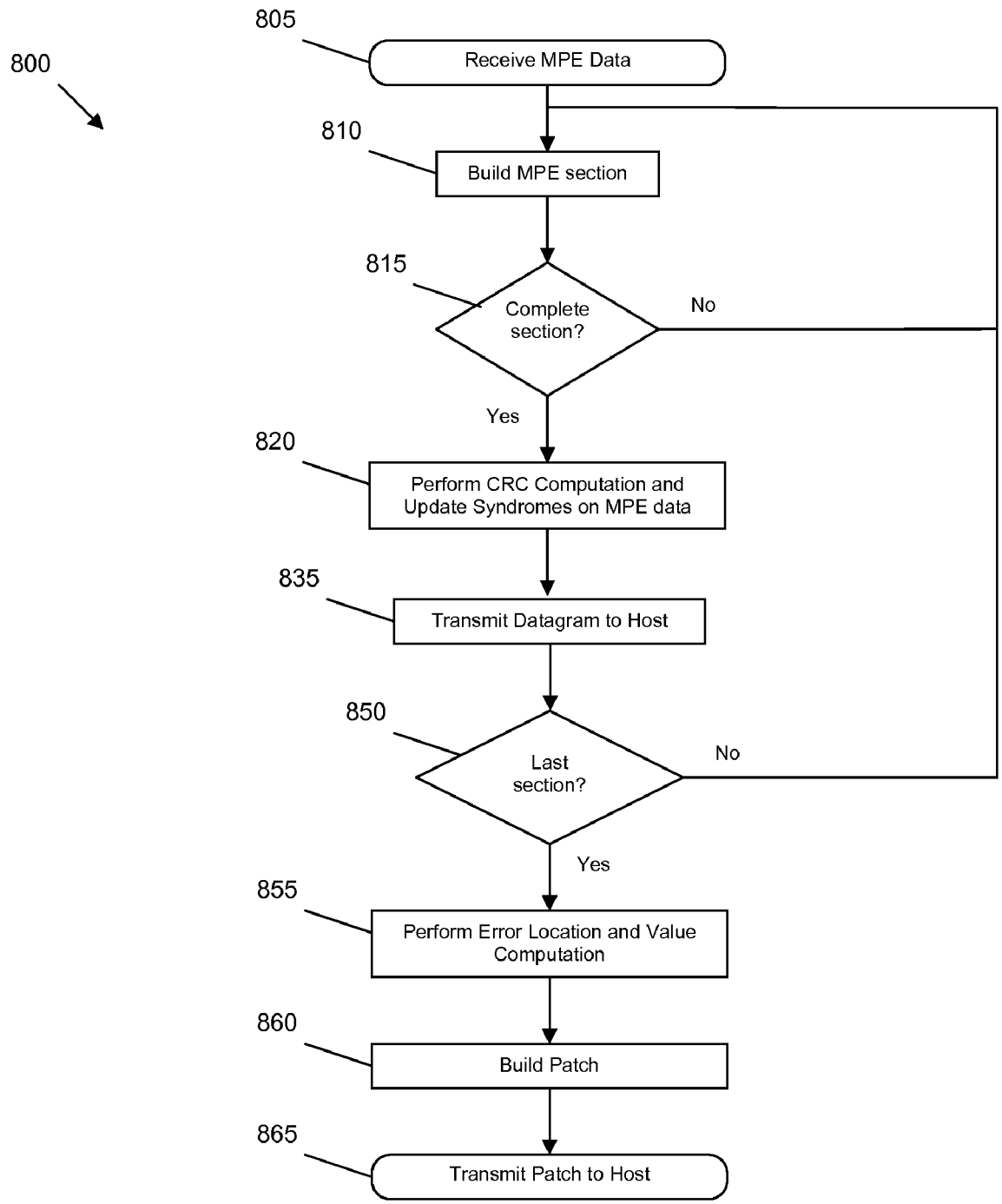
FIG. 8 illustrates a method for performing forward error correction according to a second exemplary embodiment of the invention.

Referring now to FIGS. 7 and 8, there is illustrated the FEC decoder logic 320 according to a second exemplary embodiment of the invention, and a method 800 for performing forward error correction implemented thereby.

Referring first to FIG. 8, the method 800 begins at step 805, with the receipt of data upon which forward error correction is to be performed. For the illustrated embodiment, the received data is MPE data. The FEC decoder logic 320 (illustrated in FIG. 4 and FIG. 7) receives the MPE data from a host application process, such as the signal processing logic 308.

Next, in step 810, the received MPE data is used to build an MPE section. For the embodiment illustrated in FIG. 7, this is performed by a section building logic 710. As illustrated in step 815, the section building logic 710 continues building the MPE section from receive MPE data until a complete MPE section has been built, at which point it forwards the complete MPE section to error detection logic, which for the illustrated embodiment is in the form of cyclic redundancy check (CRC) computation logic 720.

The CRC computation logic 720 performs a cyclic redundancy check on the MPE data to generate syndromes for the MPE data, in step 820, for the purpose of detecting a presence of errors within the section data, and updates syndrome information stored in, for example, FEC memory 760.

However, if one or more of the syndromes of a row are not null, in step 825, the row data is considered to comprise errors. Consequently, the next step 830 comprises saving, by the CRC computation logic 720 in FEC memory 760 of FIG. 7, the syndromes for the purpose of locating and calculating the errors. Having stored the syndromes, the method moves on to step 835.

In step 835, the CRC computation logic 720 of FIG. 7 determines whether the MPE column comprises application data, for example IP datagram data, or an RS column. If the column comprises application data, the application data, which for the illustrated embodiment is in the form of one or more datagrams, is transmitted back to the host application process. In this manner, application data, whether erroneous or error free, is transmitted back to the host application process, without being saved to memory. For the embodiment illustrated in FIG. 7, this is accomplished by the CRC computation logic 720 providing the application data, for example IP datagram data, to transmission logic 750. The method then moves to step 850.

Next, in step 850, it is determined whether the MPE section is the last section in, for the illustrated embodiment, an MPE-FEC frame. If the MPE section is not the last section in step 850, the method 800 loops back to step 810 where the next section is built. As will be appreciated by a skilled artisan, for the embodiment illustrated in FIG. 7, the section building logic 710 may continue to build the next section substantially simultaneously to the CRC computation logic 720 performing the cyclic redundancy check on the current section.

Referring back to step 850, if the MPE section is the last section in the MPE-FEC frame, the method 800 moves on to step 855, where error locations and values are calculated. For the embodiment illustrated in FIG. 7, the location and value of errors is calculated by error location and value computation logic 730. The error location and value computation logic 730 retrieves syndrome information from the FEC memory 760, and calculates the location and value of any errors within the received MPE data, as is known in the art.

As previously mentioned, error locations and error value computations are performed using well-known RS decoding methods. By way of example, error location may be performed based on a combination of the two following methods:

error location is given by erasure information inferred from the CRC computations of MPE data sections and MPE-FEC RS sections self error location properties; e.g. Berlekemp-Massey algorithm (enables computation of an error location polynomial from a linear system based on the values of the syndromes).

Error values may also be computed by solving a system based on the values of the syndromes.

In this second exemplary embodiment of the invention, the error location and value computation logic 730 then passes the results of the error location and value calculations to a patch building logic 740. The patch building logic 740 then generates data correction information, which for the illustrated embodiment is in the form of a data correction patch, as illustrated in step 860. The patch building logic 740 then provides the data correction patch to the transmission logic 750 for transmission to the host application process, as illustrated in step 865 of the method 800.

The data correction patch comprises, in some embodiments of the invention, information regarding corrections that are required to erroneous IP datagrams. In this manner, the patch information enables the host application process to correct any errors itself.

For the embodiment illustrated in FIGS. 7 and 8, application data such as IP datagrams are transmitted to the host application process substantially immediately, whether or not they contain errors. In this manner, the FEC decoder logic 320 is not required to store application data in memory, thereby significantly reducing the required memory. The host application process, for example the signal processing logic 308, continues to store the application data until it receives the patch from the FEC decoder logic 320. Upon receipt of the patch, the host application process is able to use the patch to correct any errors present within the application data.

For example, traditionally a data column is corrected by subtracting the error value from the relevant data. For the embodiment illustrated in FIGS. 7 and 8, the patch building logic 740 generates an error vector. The host application is then able to apply the error vector in order to subtract the error value from the appropriate MPE data column.

As previously mentioned, for known MPE-FEC decoder modules, it is necessary for the MPE-FEC decoder modules to comprise sufficient memory to store at least one entire MPE-FEC frame (over 2 Mbits). However, for the embodiment illustrated in FIGS. 7 and 8, this memory requirement can be reduced from more than 2 Mbit to approximately 0.54 Mbits, a saving of almost 75%.

Furthermore, it is often necessary for an FEC module to be capable of handling two successive MPE-FEC frames concurrently. For known implementations, in practice this requires approximately 5 Mbits of memory, taking into account memory requirements other than those for storing received MPE-FEC frames. For the embodiment illustrated in FIGS. 7 and 8, the memory requirement can be reduced to approximately 1.1 Mbits (2×0.54 Mbits).

As will be appreciated by a skilled artisan, such reductions in required space, in particular for implementations required to handle two successive frames concurrently, are significant in the context of IC packages.

Although the invention has been described herein, and illustrated in the accompanying drawings, in relation to a decoder for MPE-FEC decoding, it will be appreciated by one of ordinary skilled in the art, the invention may be equally applied to alternative decoder implementations, and in particular to alternative forward error correction implementations.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

In particular, it is envisaged that the aforementioned inventive concept can be applied by a semiconductor manufacturer to any integrated circuit architecture supporting an improved decoder. It is further envisaged that, for example, a semiconductor manufacturer may employ the inventive concept in a design of a stand-alone device, or application-specific integrated circuit (ASIC) and/or any other sub-system element employing an integrated circuit to support an improved decoder.

It will be appreciated that any suitable distribution of logicality between different logical units or controllers or memory elements, may be used without detracting from the inventive concept herein described. Hence, references to specific logical devices or elements are only to be seen as references to suitable means for providing the described logicality, rather than indicative of a strict logical or physical structure or organization.

Aspects of the invention may be implemented in any suitable form including hardware, software, firmware or any combination of these. The elements and components of an embodiment of the invention may be physically, logically and logically implemented in any suitable way. Indeed, the logicality may be implemented in a single unit or IC, in a plurality of units or ICs or as part of other logical units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved data communication unit comprising a decoder, data communication network and method of decoding have been described, where the aforementioned disadvantages with prior art arrangements have been substantially alleviated.

The invention claimed is:

1. An integrated circuit comprising:
forward error correction (FEC) decoder logic arranged to receive data, comprising application data, from a host application process; and perform error detection upon the received data;
wherein the FEC decoder logic comprises or is operably coupled to logic arranged to transmit error free and erroneous application data back to the host application process; generate error correction information; and transmit the error correction information to the host application process; wherein the FEC decoder logic is adapted to generate an error correction patch comprising the error correction information.

2. The integrated circuit of claim 1 further comprising:
column building logic adapted to build MPE columns from received MPE data comprising application data; and
error detection logic adapted to detect a presence of one or more errors within the MPE columns, and initiate a transmission of erroneous and error free application data back to the host application process, in response thereto.

3. The integrated circuit of claim 2 further comprising:
error location and value computation logic operably coupled to the error detection logic and adapted to determine a location of value of one or more detected errors; and
patch building logic operably coupled to the error location and value computation logic and adapted to generate error correction patches, and to initiate a transmission of error correction patches to the host application process.

4. The integrated circuit of claim 1 wherein by the FEC decoder logic is adapted to perform cyclic redundancy check (CRC) computation to generate one or more syndromes for detecting a presence of errors.

5. The integrated circuit of claim 4 wherein the FEC decoder logic is adapted to use one or more syndromes within error location and value computations.

6. The integrated circuit of claim 1 wherein the application data comprises Internet Protocol (IP) datagram data.

7. The integrated circuit of claim 6 wherein the FEC decoder logic is adapted to use one or more RS columns within error location and value computations.

8. The integrated circuit of claim 1 wherein the received data comprises multi-protocol encapsulation (MPE) data.

9. The integrated circuit of claim 8 wherein the FEC decoder logic is adapted to build an MPE column with the MPE data, and upon building a complete MPE column, performing error detection upon the complete MPE column.

10. The integrated circuit of claim 9 wherein the FEC decoder logic is adapted to determine whether the MPE column comprises application data or a Reed Solomon (RS) column.

11. The integrated circuit of claim 9 wherein the FEC decoder logic is adapted to determine if an MPE column is the last MPE column of an MPE-FEC frame, and if the column is the last column, the FEC decoder performs error location and value computation for one or more detected errors substantially simultaneously upon a number of erroneous columns within the MPE-FEC frame.

12. A method for performing forward error correction, the method comprising the steps of:
receiving data comprising application data from a host application process;
performing error detection upon the received data;
transmitting error free and erroneous application data back to the host application process;
generating error correction information comprising an error correction patch; and
transmitting error correction information to the host application process.

13. The method of claim 12 further comprising performing cyclic redundancy check (CRC) computations to generate one or more syndromes for detecting a presence of errors.

14. The method of claim 13 further comprising using one or more syndromes within error location and value computations.

15. The method of claim 12 wherein the application data comprises Internet Protocol (IP) datagram data.

16. The method of claim 12 wherein the received data comprises multi-protocol encapsulation (MPE) data.

17. The method of claim 16 further comprises building an MPE column with the MPE data, and upon building a complete MPE column, performing error detection upon the complete MPE column.

18. The method of claim 17 further comprises determining whether the MPE column comprises application data or a Reed Solomon (RS) column.

19. The method of claim 18 further comprises using RS columns within error location and value computations.

20. The method of claim 17 further comprises:
determining if an MPE column is the last MPE column of an MPE-FEC frame, and if the column is the last column;
performing error location and value computation for detected errors substantially simultaneously upon a number of erroneous columns within the MPE-FEC frame.

* * * * *